United States Patent
Väänänen

(10) Patent No.: US 8,184,761 B2
(45) Date of Patent: May 22, 2012

(54) CONTROLLING PHASE LOCKED LOOP

(75) Inventor: Paavo Väänänen, Nokia (FI)

(73) Assignee: Nokia Corporation, Espoo (FI)

(*) Notice: Subject to any disclaimer, the term of this patent is extended or adjusted under 35 U.S.C. 154(b) by 1099 days.

(21) Appl. No.: 11/896,284

(22) Filed: Aug. 30, 2007

(65) Prior Publication Data

US 2008/0317186 A1 Dec. 25, 2008

(30) Foreign Application Priority Data

Jun. 21, 2007 (FI) .................................... 20075478

(51) Int. Cl.
*H03D 3/24* (2006.01)

(52) U.S. Cl. ........ 375/376; 375/254; 375/260; 375/267; 375/355; 375/371; 375/373; 375/374; 375/375

(58) Field of Classification Search .................. 375/260, 375/254, 355, 371, 373, 374, 375, 376; 327/115, 327/156; 331/11, 16, 17, 44; 332/119, 127
See application file for complete search history.

(56) References Cited

U.S. PATENT DOCUMENTS

| | | | |
|---|---|---|---|
| 6,157,694 A | 12/2000 | Larsson | |
| 7,425,874 B2 * | 9/2008 | Risbo et al. | 331/1 A |
| 7,519,135 B2 * | 4/2009 | Staszewski et al. | 375/346 |
| 7,605,662 B2 * | 10/2009 | Kobayashi et al. | 331/11 |
| 2004/0036539 A1 * | 2/2004 | Hammes et al. | 331/16 |
| 2005/0024152 A1 * | 2/2005 | Lyden et al. | 331/16 |
| 2006/0046663 A1 * | 3/2006 | Yu | 455/76 |
| 2007/0040940 A1 * | 2/2007 | Wang et al. | 348/536 |
| 2007/0121773 A1 * | 5/2007 | Kuan et al. | 375/376 |
| 2008/0094145 A1 | 4/2008 | Kuan et al. | |

* cited by examiner

*Primary Examiner* — Dhaval Patel
(74) *Attorney, Agent, or Firm* — Squire Sanders (US) LLP

(57) ABSTRACT

A method and apparatus for controlling phase locked loop are provided. The apparatus includes a voltage controlled oscillator configured to generate an output signal with a frequency proportional to a control voltage fed into the oscillator. The apparatus also includes an analog loop filter connected to the oscillator and configured to form the control voltage for the oscillator, and a charge pump configured to generate a current pulse into the loop filter. The apparatus includes a phase-frequency detector operationally connected to the charge pump and configured to form waveforms, based on a reference signal and a feedback signal, the feedback signal being proportional to the output signal of the oscillator. The apparatus further includes a controller configured to modulate the feedback signal on the basis of the frequency or phase error of the output signal of the voltage controlled oscillator and the reference signal.

26 Claims, 5 Drawing Sheets

CONTROLLING PHASE LOCKED LOOP

FIELD

The invention relates to a method and an apparatus controlling a phase locked loop. Especially the invention relates to phase locked loops implemented on an integrated circuit.

BACKGROUND

A phase locked loop (PLL) implemented with an integrated circuit (IC) provides an efficient tool in implementing high-frequency local oscillator and clock signals for radio transceivers in telecommunication systems. A phase locked loop is known as a feedback system for providing electric signals that are accurate in frequency and stable in phase. A typical phase locked loop includes a voltage controlled oscillator (VCO), an analog loop filter, a charge pump, a phase-frequency detector unit and a frequency divider with a frequency division ratio (M) in a feedback loop. The voltage controlled oscillator is set into a negative feedback control loop which forces it to oscillate in a frequency defined with the frequency divider and a given reference frequency $F_{ref}$.

In a conventional charge-pump based phase locked loop, the stability and the settling performance of the loop are defined by the gain of the voltage controlled oscillator, the division ratio of the frequency divider, gain of the phase-frequency detector and the charge pump, and the frequency response of the analog loop filter. FIG. 1 shows an example of the implementation of the analog loop filter. C1 is the capacitor integrating the current pulses generated by the charge pump. With proper design, dominant time constants introduced by the C1, C2 and R1 can be set so that the phase locked loop is stable in all conditions with a desired closed loop bandwidth and loop settling time. R2, C3, R3 and C4 form high frequency poles that have minor impact on the settling behavior and stability of the loop.

However, a problem with the traditional analog filter design is that with practical implementations for communications systems the loop filter takes a quite a lot of space in silicon. Another alternative is to use external components which increase the circuit board area and cost. This is especially problem with fractional phase locked loops where M is low and the loop filter impedance level has to be relatively low for gaining the suitable values for charge pump current and VCO gain. This leads to large capacitance values for C1 and especially for C2, of which value is typically around 10 times higher than C1 when the loop is designed for a radio transceiver used in a mobile communication device.

BRIEF DESCRIPTION OF THE INVENTION

An object of the invention is to provide an improved phase locked loop control solution overcoming the above problems and providing additional advantages. According to an aspect of the invention, there is provided a controller of a phase locked loop comprising as an output a signal proportional to a reference signal and a feedback signal, the controller being configured to modulate the feedback signal on the basis of the frequency or phase error of the output signal of the phase locked loop and the reference signal.

According to another aspect of the invention, there is provided an apparatus comprising: a voltage controlled oscillator configured to generate an output signal with a frequency proportional to a control voltage fed into the voltage controlled oscillator; an analog loop filter operationally connected to the voltage controlled oscillator and configured to form the control voltage for the voltage controlled oscillator; a charge pump configured to generate a current pulse into the loop filter; a phase-frequency detector operationally connected to the charge pump and configured to form waveforms, based on a reference signal and a feedback signal, the feedback signal being proportional to the output signal of the voltage controlled oscillator; and a controller configured to modulate the feedback signal on the basis of the frequency or phase error of the output signal of the voltage controlled oscillator and the reference signal.

According to another aspect of the invention, there is provided a controller of a phase locked loop comprising as an output a signal proportional to a reference signal and a feedback signal, the controller comprising means for modulating the feedback signal on the basis of the frequency or phase error of the output signal of the phase locked loop and the reference signal.

According to another aspect of the invention, there is provided an apparatus comprising: oscillator means for generating an output signal with a frequency proportional to a control voltage fed into the oscillator means; analog filtering means operationally connected to the oscillator means and configured to form the control voltage for the oscillator means; generating means for generating a current pulse into the loop filter; detecting means operationally connected to the generating means and configured to form waveforms, based on a reference signal and a feedback signal, the feedback signal being proportional to the output signal of the oscillator means; and controlling means for modulating the feedback signal on the basis of the frequency or phase error of the output signal of the oscillator means and the reference signal.

According to another aspect of the invention, there is provided a method, comprising: generating an output signal in a phase locked loop, the signal being proportional to a reference signal and a feedback signal; and modulating the feedback signal on the basis of the frequency or phase error of the output signal of the phase locked loop and the reference signal.

According to another aspect of the invention, there is provided a method, comprising: generating a control signal of a voltage controlled oscillator in a generator and an analogue filter, the signal being proportional to a reference signal and a feedback signal; selecting the transfer function of an analogue loop filter to filter out using high frequency poles the high-frequency noise generated by a delta-sigma modulator, generating an output signal in a phase locked loop, on the basis of the control signal, modulating the feedback signal of the phase locked loop on the basis of the frequency or phase error of the output signal of the phase locked loop and the reference signal.

Embodiments of the invention provide several advantages. The described phase locked loop control technique reduces the silicon area required to realize the phase locked loop using an integrated circuit. In addition, the tolerances of the analog components of the phase locked loop have a reduced effect on loop response.

LIST OF DRAWINGS

In the following, the invention will be described in greater detail with reference to the embodiments and the accompanying drawings, in which FIG. 1 shows an example of a prior art analog loop filter;

DESCRIPTION OF EMBODIMENTS

Figure 2:
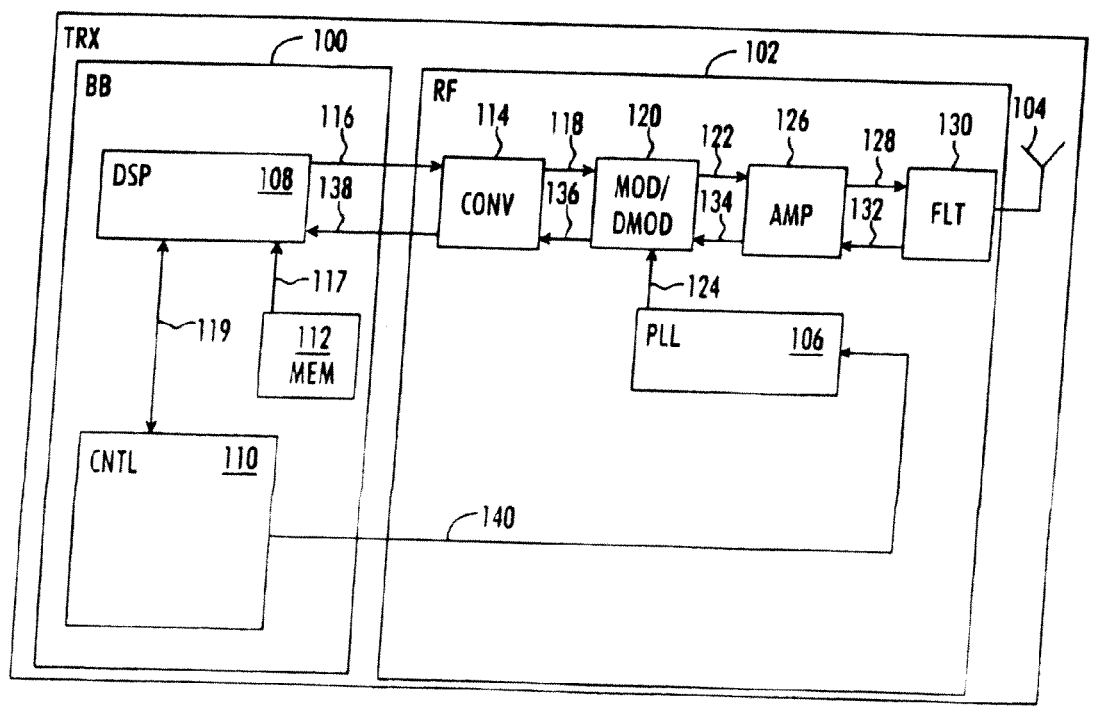
FIG. 2 shows an example of a transceiver to which embodiments of the invention may be applied.

FIG. 2 shows an exemplary transceiver to which embodiments of the invention may be applied. The transceiver includes a base band part 100 (BB), a radio frequency part 102 (RF) connected to the base band part 100, and an antenna 104 connected to the radio frequency part 102. The exemplified radio frequency part 102 includes a phase locked loop 106.

The base band part 100 includes a digital signal processor 108 and a control unit 110, and a memory 112 operationally connected 117, 119 to the processor. A portion of the base band part 100 may be implemented with an application specific integrated circuit (ASIC). The control unit 110 may be implemented with a processor, discrete logic components and associated software. The memory may be used to store software and data.

In transmission, a converter unit 114 receives a transmit base band digital signal 116 from the base band part 100 and converts the transmit base band digital signal 116 into a transmit base band analog signal 118. The transmit base band analog signal 118 is inputted into a modulator-demodulator unit 120, which up-converts the transmit base band analog signal 118 into a radio frequency, thus providing a transmit radio frequency signal 122.

The output frequency 124 of the phase locked loop 106 is inputted into the modulator-demodulator unit 120. The modulator-demodulator unit 120 may include a mixer for mixing the transmit base band analog signal 118 and the output frequency 124. The mixer generates the transmit radio frequency signal 122, whose frequency is generally an algebraic sum of the output frequency 124 and the frequency of the transmit base band analog signal 118.

The transmit radio frequency signal 122 is inputted into an amplifier unit 126, which amplifies the transmit radio frequency signal 122, thus providing an amplified transmit antenna signal 128. The amplification may be implemented by using a linear amplifier, for example.

The amplified transmit signal 128 is fed into the filter unit 130, which attenuates undesired signal components from the amplified transmit signal 128, thus providing a desired transmit antenna signal for the antenna 104.

In reception, the antenna 104 converts the electromagnetic field providing the air interface into a receive antenna signal. The receive antenna signal is inputted into the filter unit 130, which attenuates undesired signal components of the receive antenna signal, thus producing a receive radio frequency signal 132. The filter unit 130 may be a duplex filter for separating the transmit antenna signal from the receive antenna signal.

The receive radio frequency signal 132 is inputted into the amplifier unit 126, which amplifies the receive radio frequency signal 132 by means of a low noise amplifier, for example. As a result of amplification an amplified receive signal 134 is obtained.

The amplified receive signal 134 is inputted into the modulator-demodulator unit 120, which down-converts the amplified receive signal 134 into the base band frequency, thus providing a receive base band analog signal 136. The down-conversion may be based on mixing the amplified receive signal 134 with the output frequency 124 of the phase locked loop 106.

The receive base band analog signal 136 is inputted into the converter unit 114, whose analog-to-digital converter samples the receive base band analog signal 136 and produces a receive base band digital signal 138. The receive base band digital signal 138 is inputted into the base band parts 100.

The control unit may control the operation of the phase locked loop with a control signal 140.

A transceiver may include a plurality of phase locked loops 106 with associated control signals 140. Different phase locked loops 106 may be utilized for producing different frequencies for down-conversion and up-conversion. Furthermore, a phase locked loop may be used for providing intermediate frequencies. It is clear to a person skilled in the art to implement an arrangement including a plurality of phase locked loops.

Figure 3:
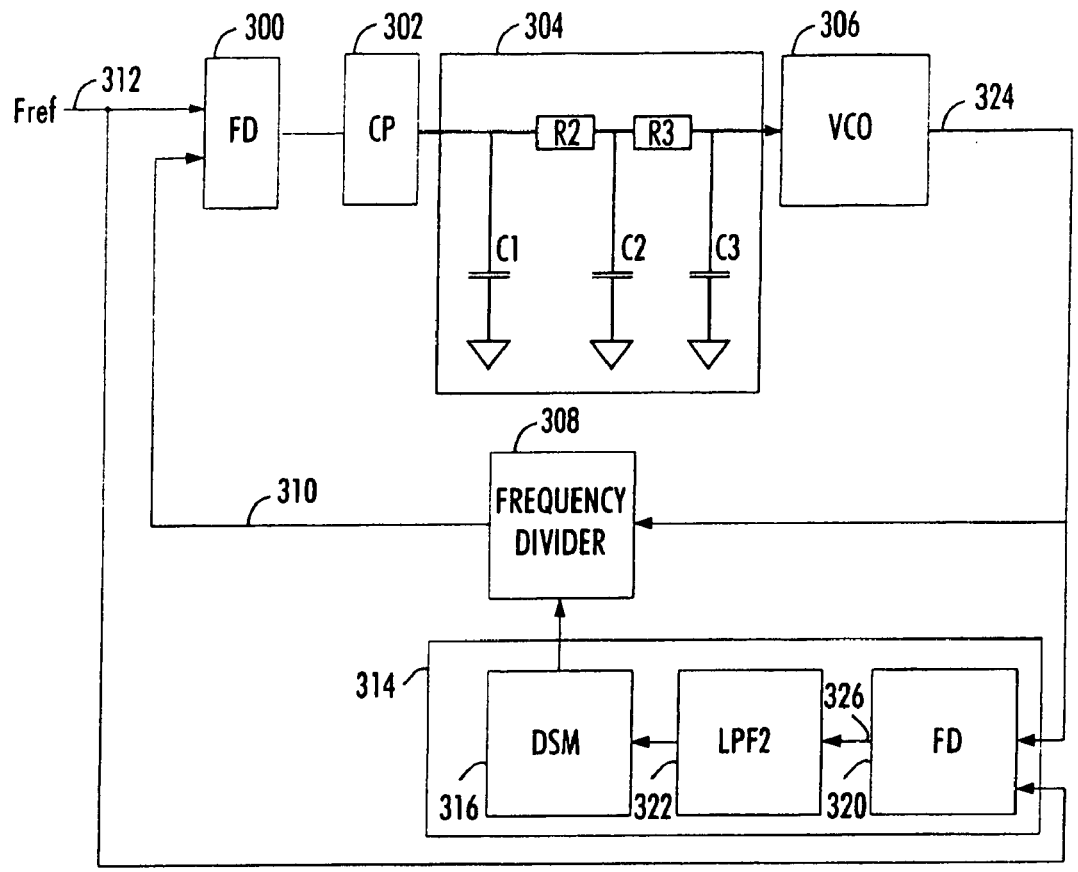
FIG. 3 illustrates an example of a phase lock loop to which embodiments of the invention may be applied.

FIG. 3 illustrates an example of a phase lock loop to which embodiments of the invention may be applied. The phase locked loop comprises a phase-frequency detector unit 300, a charge pump 302, an analog loop filter 304, a voltage controlled oscillator (VCO) 306 and a frequency divider 308 with a frequency division ratio (M) in a feedback loop.

The output signal 324 of the VCO 306 is connected to the frequency divider 308 of the feedback loop. The frequency divider 308 divides the signal with a frequency division ratio M. The output signal 310 of the frequency divider 308 is taken to the phase-frequency detector unit 300 where the phase of the output signal of the frequency divider is compared with a phase of the reference clock signal in frequency $F_{ref}$ 312. The phase-frequency detector 300 and the charge pump 302 output is a current pulse having a width relative to a time difference between the edges of reference frequency signal pulses and feedback signal pulses. The analog loop filter 304, which may be formed using a passive RC-circuitry, integrates the current pulses and produces a voltage relative to the measured phase error between the reference frequency signal and the feedback signal. The average voltage settles to a value that forces the VCO 306 to oscillate on a frequency $M*F_{ref}$.

The phase locked loop may comprise a controller 314 controlling the feedback loop. The controller may comprise a delta-sigma modulator 316 configured to modulate the frequency division ratio M of the frequency divider 308 in such a manner that fractional average division ratios are achieved. A phase locked loop without a delta sigma modulator can only achieve output frequencies which are integer multiples of the used reference frequency $F_{ref}$. Thus, the reference frequency needs to be selected according to a channel raster. With use of a delta-sigma modulator 316, any fractional multiple of the reference frequency that is covered by the VCO tuning range can be created. The selection of the reference frequency $F_{ref}$ does not limit the frequency of the output signal of the phase locked loop.

In an embodiment, the controller 314 is configured to modulate the feedback signal on the basis of the frequency or phase error of the output signal 324 of the phase locked loop and the reference signal 312. The controller may be configured to quantize determine the frequency or phase error of the output signal 324 of the phase locked loop and the reference signal 312. The quantized signal 326 is filtered in a digital filter 322 and the filter output is used to control the modulation of the frequency division ratio of the frequency divider 308.

The above-described modulation of the feedback signal stabilizes the phase locked loop in such a manner that the structure of the analog loop filter can be simplified. In the example of FIG. 3, the analog loop filter 304 includes capacitors C1, C2 and C3 and resistors R2 and R3. Compared to the prior art loop filter, the loop filter 304 of FIG. 3 lacks capacitor C4 and resistor R1. Due to the smaller number of analog components, the size of the phase locked loop on an integrated chip is reduced.

In an embodiment, the controller comprises a frequency detection unit 320 having as an input the output signal of the phase locked loop 324 and the reference signal 312 and as an output a signal 326 which is proportional to the frequency or phase error of the input signals on the unit.

The instant frequency error of the phase locked loop output signal 324 compared to the reference frequency can be measured using a combination of a synchronous digital counter and asynchronous time-to-digital conversion based on a delay line, for example. Thus, during one clock cycle of the reference signal the full cycles of the VCO output are counted with a counter. The fractional part of the time difference between edges of the VCO output signal and reference output signal is then sampled with time-to-digital conversion, to gain an accurate enough error signal 326, which is then fed to the digital filter 322.

Figure 4A:
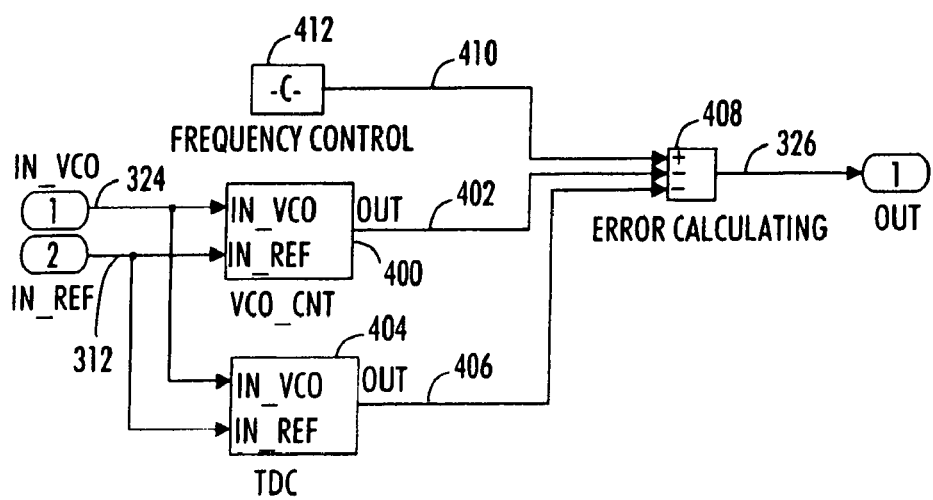
FIG. 4A illustrates an example of the structure of a frequency detection unit.

FIG. 4A illustrates an example of the structure of the frequency detection unit 320. The input signals of the frequency detection unit comprise the output signal of the phase locked loop 324 and the reference signal 312 and as an output a signal 326 which is proportional to the frequency or phase error of the input signals on the unit. In this example, the frequency detection unit 320 comprises a synchronous digital counter VCO_CNT 400. The counter VCO_CNT is simple counter counting the full VCO cycles. The counter produces an output digital word 402 proportional to the amount of the full VCO output signal 324 cycles during one reference clock 312 cycle.

To improve the accuracy of the frequency detection unit, the unit comprises an asynchronous time-to-digital conversion unit TDC 404. The conversion unit TDC 404 produces a digital word 406 proportional to the fraction of one full output cycle of the VCO.

The output 402 of the counter 400 and the output 406 of the conversion unit 404 are taken to an error calculation unit 408 where they are compared to a frequency control constant 410 obtained from a frequency control unit 412. The output signal 326 of the error calculation unit 408 is proportional to the instant frequency error between $F_{ref}*M$ and the VCO output frequency.

Figure 4B:
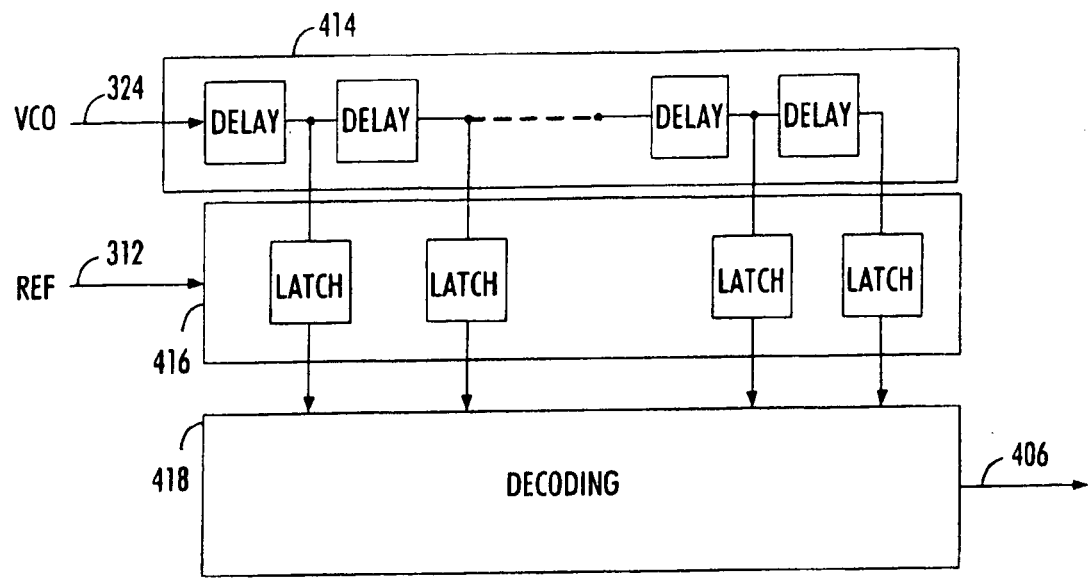
FIG. 4B illustrates an example of the structure of a time-to-digital converter unit.

FIG. 4B illustrates an example of the structure of the time-to-digital conversion unit TDC 404. The unit comprises a delay line 414 comprising a set of delay elements, a set 416 of latches, each latch connected to the output of a delay element, and a decoder 418. The VCO output signal 324 is driven to the delay line 414 and each delay output is driven to an edge-triggered latch that is clocked with the reference signal 312. Thus, when the reference clock edge occurs the decoder 418 can read the phase difference between the VCO output and reference output from the latch outputs. The decoder is configured to decode it to a digital word 406 for error calculation.

Figure 5A:
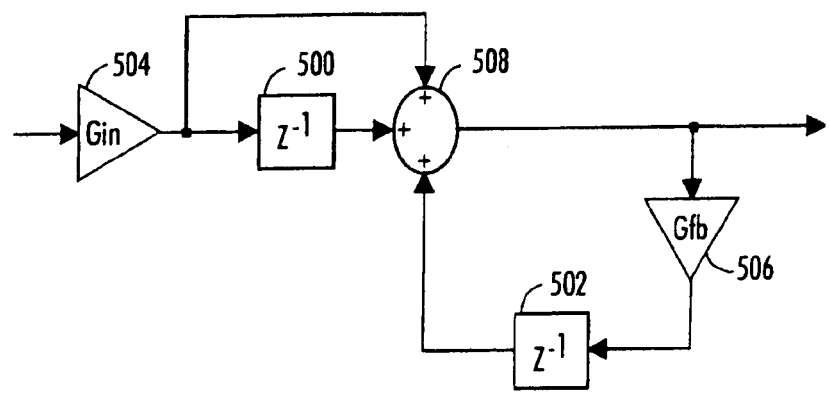
FIG. 5A illustrates an example of the structure of a digital filter.

The output of the frequency detection unit 320 is taken to a digital filter 322. The response of the digital filter 322 can be defined so that the output of the filter modulates the feedback signal through the delta-sigma modulator so that the loop response is equal to traditional charge-pump PLL. In the simplest form the filter 322 can be a first order IIR filter of which one example implementation is presented in FIG. 5A.

The filter comprises delay elements 500, 502, multipliers $G_{in}$, $G_{fb}$ 504, 506 and an adder 508. Input signal of the filter is the signal 322 from the frequency detection unit. The output of the filter is connected to the sigma delta modulator.

Figure 1:
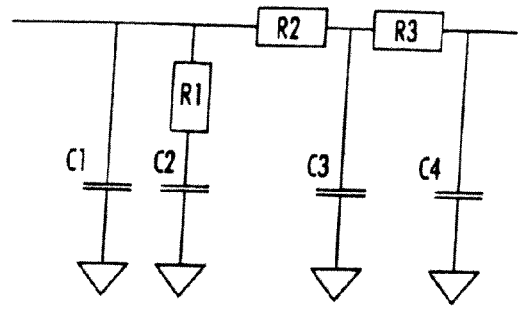
Figure 5B:
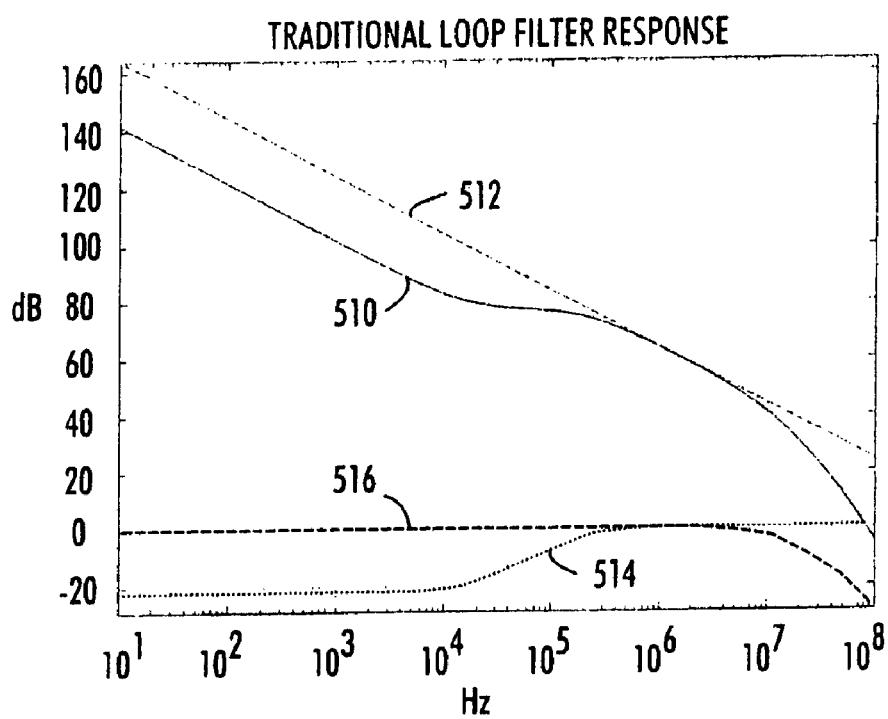
FIGS. 5B and 5C illustrate loop filter transfer functions.
Figure 5C:
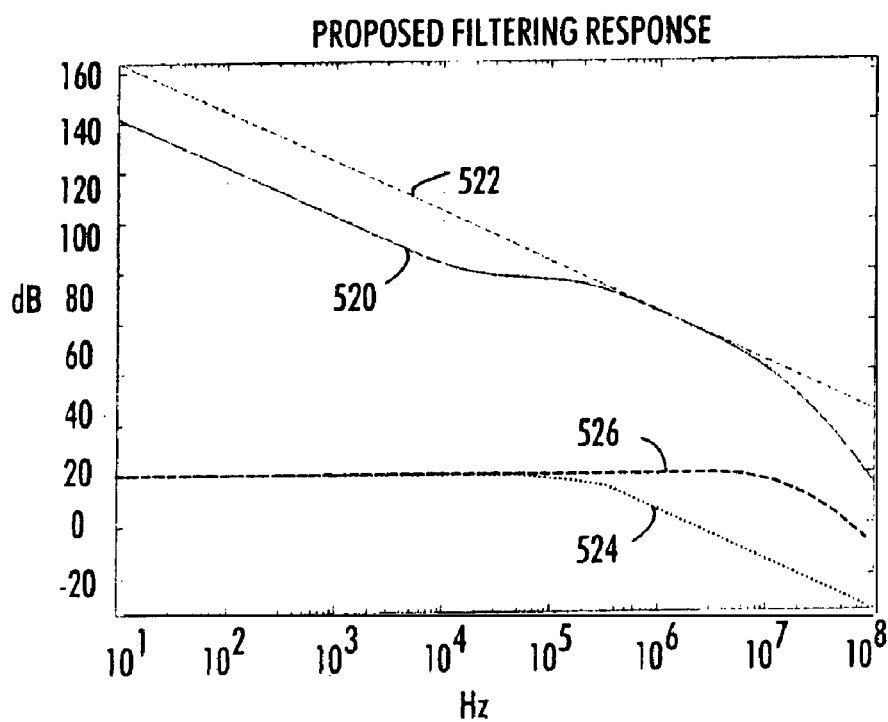

FIGS. 5B and 5C illustrate an example of the definition of the transfer function of the filter 322. FIG. 5B shows the loop filter response 510 of a conventional loop filter of FIG. 1. The response is "ideal" meaning that the resistance and capacitance values in the loop filter are assumed to have no parasitic effects. X-axis shows frequency in Hz, logarithmic scale. Y-axis shows response in dB. The total transfer function 510 can be divided into three components, 512, 514 and 516. First, there is an integrator response 512 which is mainly dominated by the value of C1. Second, there is a zero-pole response 514 which depends mainly on the values of C1, C2, and R1. Finally, there is a high frequency low-pass function 516 that is caused by C1, C2 and R1 loaded with C3, C4, R3, and R4.

FIG. 5C illustrates the loop filter response 520 obtained using the solution of FIG. 3. In this example, the transfer function 520 similar to the response 510 of the FIG. 5B can be achieved with the proposed method and digital low pass filter whose corner frequency and gain are proportional to s-plane location of the zero and pole in the "zero-pole" part of the traditional loop filter. FIG. 4D shows an example how the filtering functions can be selected.

First, there is an integrator response 522 similar to the respective curve in FIG. 5B. The digital filter 322 response is denoted with 524 and the high frequency low-pass function is denoted with 526.

It should be noted that the structures and curves presented in FIGS. 4A, 4B and 5A to 5C are merely examples of possible implementations. Similar functionality may also be achieved using other structures, as one skilled in the art is aware.

Figure 6:
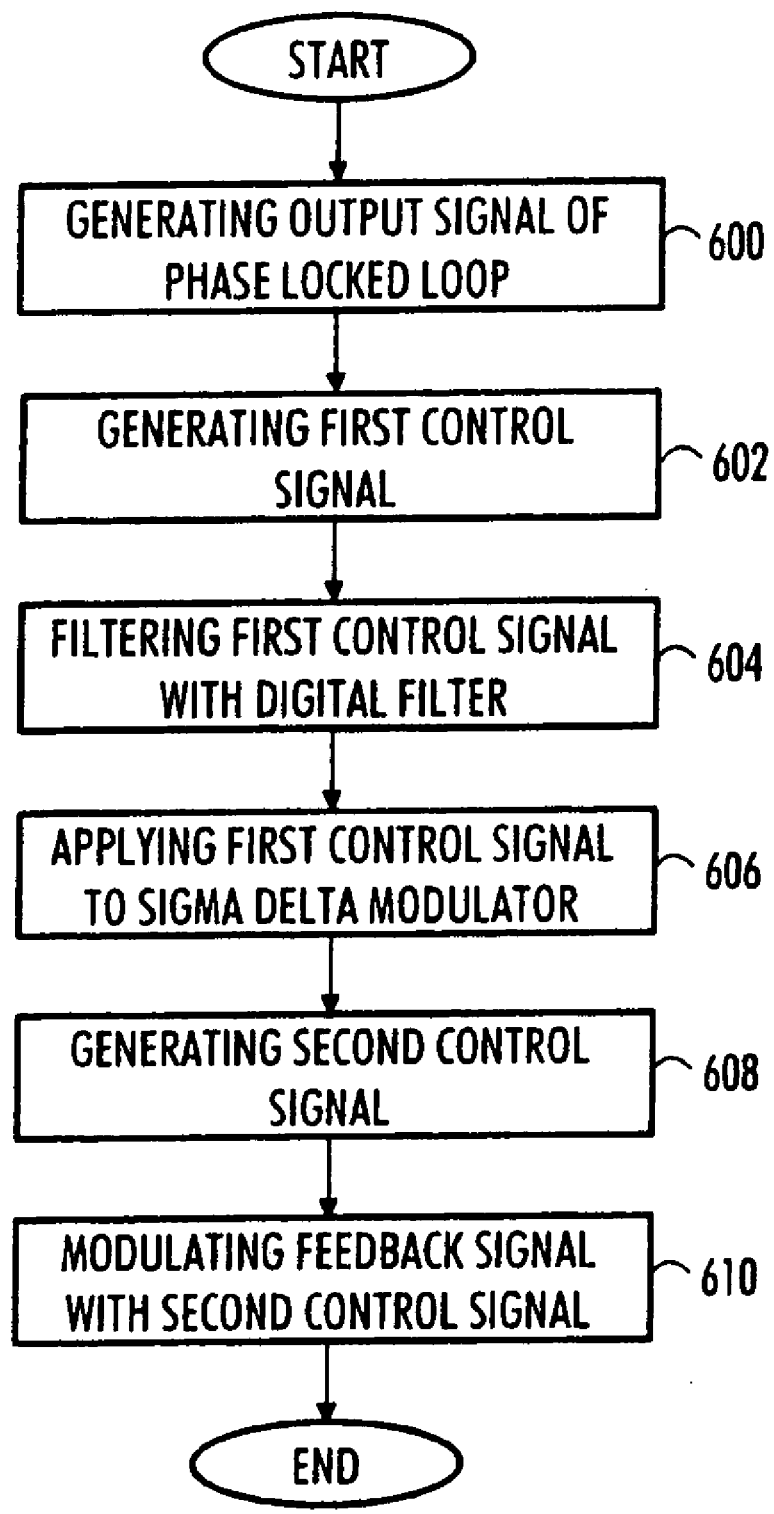
FIG. 6 is a flowchart illustrating an embodiment of the invention.

FIG. 6 is a flowchart illustrating an embodiment of the invention.

In step 600, an output signal of a phase locked loop is generated in the phase locked loop, the signal being proportional to a reference signal and a feedback signal.

In step 602, a first control signal is generated on the basis of the frequency or phase error of the output signal of the phase locked loop and the reference signal.

In step 604 the first control signal is filtered with a digital filter.

In step 606, the first control signal is applied to a sigma delta modulator.

In step 608, a second control signal is generated in the sigma delta modulator on the basis of the first control signal.

In step 610, the feedback signal is modulated with the second control signal.

Even though the invention has been described above with reference to an example according to the accompanying drawings, it is clear that the invention is not restricted thereto but it can be modified in several ways within the scope of the appended claims.

I claim:

1. A controller of a phase locked loop comprising, as an output, a signal proportional to a reference signal of the phase locked loop and a feedback signal, the controller being configured to modulate the feedback signal on the basis of a frequency or phase error of the output signal of the phase locked loop and the reference signal of the phase locked loop.

2. The controller of claim 1, further comprising:
    a frequency detection unit having, as an input, the output signal of the phase locked loop and the reference signal and, as an output, a signal which is proportional to the frequency or phase error of the input signals on the unit.

3. The controller of claim 2, further comprising:
a digital filter unit configured to filter the output signal of the frequency detection unit.

4. The controller of claim 3, further comprising:
a delta sigma modulator having as an input the output signal of the digital filter and as an output a signal modulating the feedback signal.

5. The controller of claim 3, wherein the phase locked loop comprises a frequency divider configured to adjust the frequency of the feedback signal, and the delta sigma modulator is configured to control the frequency division ratio of the frequency divider.

6. A controller of a phase locked loop comprising, as an output, a signal proportional to a reference signal and a feedback signal, the controller being configured to modulate the feedback signal on the basis of a frequency or phase error of the output signal of the phase locked loop and the reference signal;
a frequency detection unit having, as an input, the output signal of the phase locked loop and the reference signal and, as an output, a signal which is proportional to the frequency or phase error of the input signals on the unit, wherein the frequency detection unit comprises:
a synchronous digital counter and an asynchronous time-to-digital conversion unit connected in parallel and having as an input the output signal of the phase locked loop and the reference signal;
a frequency control unit configured to provide a frequency control constant; and
an error calculation unit connected to the outputs of the digital counter, the time-to-digital conversion unit and the frequency control unit, configured to produce an output signal proportional to the frequency error between the output signal of the phase locked loop and the reference signal.

7. The controller of claim 6, wherein the time-to-digital conversion unit comprises:
a delay line comprising a set of delay elements, the delay line having as an input the output signal of the phase locked loop;
a set of latches, each latch connected to the output of a delay element, the latched controlled by the reference signal; and
a decoder configured to decode the outputs of the latches into a digital word proportional to the frequency or phase error of the output signal of the phase locked loop and the reference signal.

8. The controller of claim 6, wherein the synchronous digital counter is configured to produce an output signal proportional to the amount of the full signal cycles of the output signal of the phase locked loop during one reference clock cycle.

9. The controller of claim 3, wherein the digital filter unit is realized with an IIR filter.

10. An apparatus, comprising:
a voltage controlled oscillator configured to generate an output signal with a frequency proportional to a control voltage fed into the voltage controlled oscillator;
an analog loop filter operationally connected to the voltage controlled oscillator and configured to form the control voltage for the voltage controlled oscillator;
a charge pump configured to generate a current pulse into the analog loop filter;
a phase-frequency detector operationally connected to the charge pump and configured to form waveforms, based on a reference signal of the phase locked loop and a feedback signal, the feedback signal being proportional to the output signal of the voltage controlled oscillator; and
a controller configured to modulate the feedback signal on the basis of the frequency or phase error of the output signal of the voltage controlled oscillator and the reference signal of the phase locked loop.

11. The apparatus of claim 10, further comprising
a frequency detection unit having as an input the output signal of the voltage controlled oscillator and the reference signal and as an output a signal which is proportional to the frequency or phase error of the input signals on the frequency detection unit.

12. The apparatus of claim 11, further comprising
a digital filter unit configured to filter the output signal of the frequency detection unit.

13. An apparatus, comprising:
a voltage controlled oscillator configured to generate an output signal with a frequency proportional to a control voltage fed into the voltage controlled oscillator;
an analog loop filter operationally connected to the voltage controlled oscillator and configured to form the control voltage for the voltage controlled oscillator;
a charge pump configured to generate a current pulse into the analog loop filter;
a phase-frequency detector operationally connected to the charge pump and configured to form waveforms, based on a reference signal and a feedback signal, the feedback signal being proportional to the output signal of the voltage controlled oscillator;
a controller configured to modulate the feedback signal on the basis of the frequency or phase error of the output signal of the voltage controlled oscillator and the reference signal; and
a frequency detection unit having as an input the output signal of the voltage controlled oscillator and the reference signal and as an output a signal which is proportional to the frequency or phase error of the input signals on the frequency detection unit, wherein the frequency detection unit comprises:
a synchronous digital counter and an asynchronous time-to-digital conversion unit connected in parallel and having as an input the output signal of the phase locked loop and the reference signal;
a frequency control unit configured to provide a frequency control constant, and
an error calculation unit connected to the outputs of the digital counter, the time-to-digital conversion unit and the frequency control unit, configured to produce an output signal proportional to the frequency error between the output signal of the phase locked loop and the reference signal.

14. The apparatus of claim 12, further comprising:
a frequency divider configured to adjust the frequency of the feedback signal; and
a delta sigma modulator having as an input the output signal of the digital filter and as an output a signal controlling a frequency division ratio of the frequency divider.

15. The apparatus of claim 13, wherein the asynchronous time-to-digital conversion unit comprises:
a delay line comprising a set of delay elements, the delay line having as an input the output signal of the voltage controlled oscillator;
a set of latches, each latch connected to the output of a delay element, the latched controlled by the reference signal; and a decoder configured to decode the outputs of the latches into a digital word proportional to the frequency or phase error of the output signal of the voltage controlled oscillator and the reference signal.

16. The apparatus of claim 13, wherein the synchronous digital counter is configured to produce an output signal proportional to the amount of the full signal cycles of the output signal of the phase locked loop during one reference clock cycle.

17. The apparatus of claim 12, wherein the digital filter unit is realized with an IIR filter.

18. A controller of a phase locked loop comprising as an output a signal proportional to a reference signal of the phase locked loop and a feedback signal, the controller comprising means for modulating the feedback signal on the basis of the frequency or phase error of the output signal of the phase locked loop and the reference signal of the phase locked loop.

19. An apparatus, comprising:
oscillator means for generating an output signal with a frequency proportional to a control voltage fed into the oscillator means;
analog filtering means operationally connected to the oscillator means and configured to form the control voltage for the oscillator means;
generating means for generating a current pulse into the loop filter;
detecting means operationally connected to the generating means and configured to form waveforms, based on a reference signal of the phase locked loop and a feedback signal, the feedback signal being proportional to the output signal of the oscillator means; and
controlling means for modulating the feedback signal on the basis of the frequency or phase error of the output signal of the oscillator means and the reference signal of the phase locked loop.

20. A transceiver, comprising the apparatus of claim 10.

21. A method, comprising:
generating an output signal in a phase locked loop, the output signal being proportional to a reference signal of the phase locked loop and a feedback signal; and
modulating the feedback signal on the basis of a frequency or phase error of the output signal of the phase locked loop and the reference signal of the phase locked loop.

22. The method of claim 21, further comprising:
generating a first control signal on the basis of the frequency or phase error of the output signal of the phase locked loop and the reference signal.

23. The method of claim 22, further comprising:
filtering the first control signal with a digital filter.

24. The method of claim 23, further comprising:
applying the first control signal to a sigma delta modulator; and
generating a second control signal in the sigma delta modulator on the basis of the first control signal; and
modulating the feedback signal with the second control signal.

25. A method, comprising:
generating a control signal of a voltage controlled oscillator in a generator and an analogue filter, the signal being proportional to a reference signal of the phase locked loop and a feedback signal;
selecting a transfer function of an analog loop filter to filter out using high frequency poles the high-frequency noise generated by a delta-sigma modulator;
generating an output signal in a phase locked loop, on the basis of the control signal; and
modulating the feedback signal of the phase locked loop on the basis of the frequency or phase error of the output signal of the phase locked loop and the reference signal of the phase locked loop.

26. A controller, comprising:
a frequency detection unit having, as an input, an output signal of a phase locked loop, and a reference signal of the phase locked loop, and, as an output, a signal which is proportional to a frequency or phase error of the input signals on the unit; and
a digital filter unit configured to filter the output signal of the frequency detection unit,
wherein the controller is configured to control the phase locked loop and modulate a feedback signal based on the frequency or phase error of the output signal of the phase locked loop and the reference signal of the phase locked loop.

* * * * *